(12) United States Patent
Huang et al.

(10) Patent No.: US 12,374,583 B2
(45) Date of Patent: Jul. 29, 2025

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Kuan-Wei Huang, Taoyuan (TW); Yu-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 414 days.

(21) Appl. No.: 17/396,284

(22) Filed: Aug. 6, 2021

(65) Prior Publication Data
US 2022/0367251 A1 Nov. 17, 2022

Related U.S. Application Data

(60) Provisional application No. 63/187,574, filed on May 12, 2021.

(51) Int. Cl.
*H01L 21/768* (2006.01)
*H01L 21/027* (2006.01)
(Continued)

(52) U.S. Cl.
CPC .... *H01L 21/76807* (2013.01); *H01L 21/0276* (2013.01); *H01L 21/76816* (2013.01);
(Continued)

(58) Field of Classification Search
CPC .......... H01L 21/0276; H01L 21/76807; H01L 21/76816; H01L 21/76819; H01L 23/5226; H01L 23/5283; H01L 23/5329
See application file for complete search history.

(56) References Cited

U.S. PATENT DOCUMENTS

| 10,770,392 B1 * | 9/2020 | Licausi | ................ H01L 23/528 |
| 2006/0043588 A1 * | 3/2006 | Streck | ............... H01L 21/76807 |
| | | | 257/E21.279 |

(Continued)

FOREIGN PATENT DOCUMENTS

KR   20070070565 A  *  7/2007

OTHER PUBLICATIONS

Kim Shang Won, KR 20070070565 A, Jul. 4, 2007, English translated on Dec. 15, 2023 (Year: 2023).*

*Primary Examiner* — Mohsen Ahmadi
(74) *Attorney, Agent, or Firm* — Slater Matsil, LLP

(57) ABSTRACT

A patterning process that can be utilized in order to help form conductive lines within a dielectric layer of a metallization layer is provided. In an embodiment a first interfacial layer is patterned a first time, the first interfacial layer being located over a first hard mask layer over a dielectric layer, the patterning the first interfacial layer the first time forming a first opening, which is filled with a first dielectric material. The first interfacial layer is patterned a second time, the patterning the first interfacial layer the second time forming second openings in the first interfacial layer, at least one of the second openings exposing the first dielectric material. The first dielectric material is removed, and the dielectric layer is patterned a second time after the removing the first dielectric material using the first interfacial layer as a mask, the patterning the dielectric layer extending the second openings.

20 Claims, 16 Drawing Sheets

(51) Int. Cl.
  *H01L 21/311* (2006.01)
  *H01L 23/522* (2006.01)
  *H01L 23/528* (2006.01)
  *H01L 23/532* (2006.01)
(52) U.S. Cl.
  CPC .... *H01L 21/76819* (2013.01); *H01L 23/5226* (2013.01); *H01L 23/5283* (2013.01); *H01L 23/5329* (2013.01)

(56) References Cited

U.S. PATENT DOCUMENTS

| | | | | |
|---|---|---|---|---|
| 2007/0004214 | A1* | 1/2007 | Schaller | H01L 21/31116 257/E21.252 |
| 2011/0062587 | A1* | 3/2011 | Yang | H01L 21/76868 257/E23.142 |
| 2011/0076845 | A1* | 3/2011 | Tsai | H01L 21/31144 438/618 |
| 2012/0091587 | A1* | 4/2012 | Or-Bach | H01L 21/845 257/E23.145 |
| 2013/0270709 | A1* | 10/2013 | Tseng | H01L 21/31144 438/666 |
| 2013/0295755 | A1* | 11/2013 | Chang | H01L 21/76816 438/586 |
| 2014/0300000 | A1* | 10/2014 | Chao | H01L 23/5226 257/774 |
| 2016/0118347 | A1 | 4/2016 | Chao et al. | |
| 2017/0178945 | A1* | 6/2017 | Seo | H01L 21/67742 |
| 2018/0040732 | A1* | 2/2018 | Chang | H01L 29/7851 |
| 2018/0151421 | A1* | 5/2018 | Chen | H01L 21/76832 |
| 2019/0005180 | A1* | 1/2019 | Yeh | H01L 27/0207 |
| 2019/0006233 | A1* | 1/2019 | Chang | H01L 21/0228 |
| 2019/0067179 | A1* | 2/2019 | Tsai | H01L 21/02203 |
| 2019/0296210 | A1* | 9/2019 | Brink | B82Y 10/00 |
| 2020/0135640 | A1* | 4/2020 | Sio | H01L 23/528 |
| 2020/0335339 | A1* | 10/2020 | Yang | H01L 21/0338 |
| 2020/0350206 | A1 | 11/2020 | Ren et al. | |
| 2023/0050514 | A1* | 2/2023 | Chen | H01L 21/76811 |

\* cited by examiner

SEMICONDUCTOR DEVICES AND METHODS OF MANUFACTURE

PRIORITY CLAIM

This application claims the benefit of U.S. Provisional Application No. 63/187,574, filed on May 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) and conductive routing by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
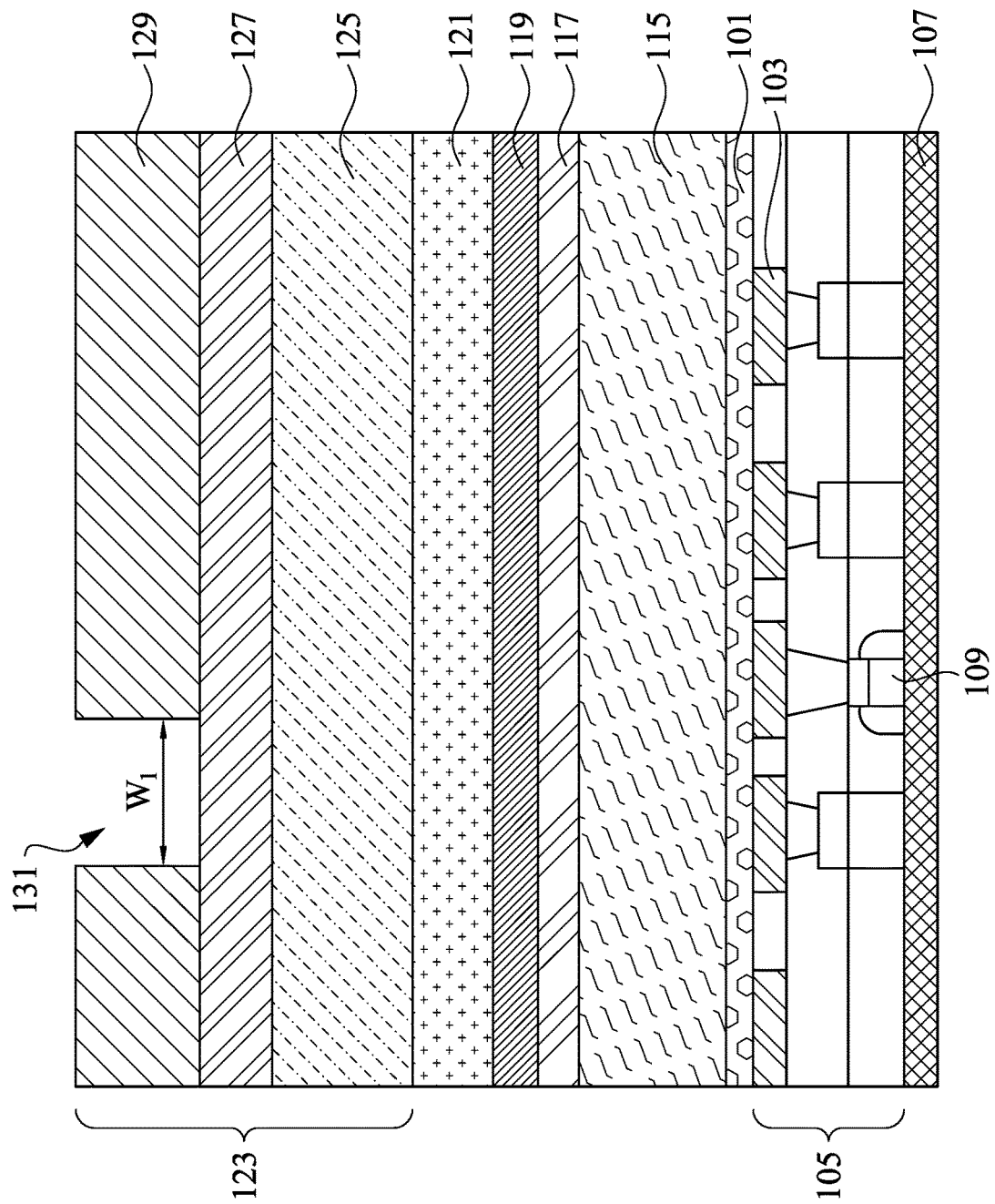
FIGS. 1A-1B illustrate a patterning of a photoresist, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a back end of line interconnect integration process which exhibits better throughput, lower defects, and lower costs in order to help achieve critical dimensions less than, e.g., 12 nm. The ideas presented, however, are not intended to be limited to the precise embodiments discussed herein and described below, and may be implemented in a wide variety of embodiments, including manufacturing processes at the 3 nm node, 2 nm node, or smaller. All such embodiments are fully intended to be included within the scope of the descriptions presented.

Figure 1B:
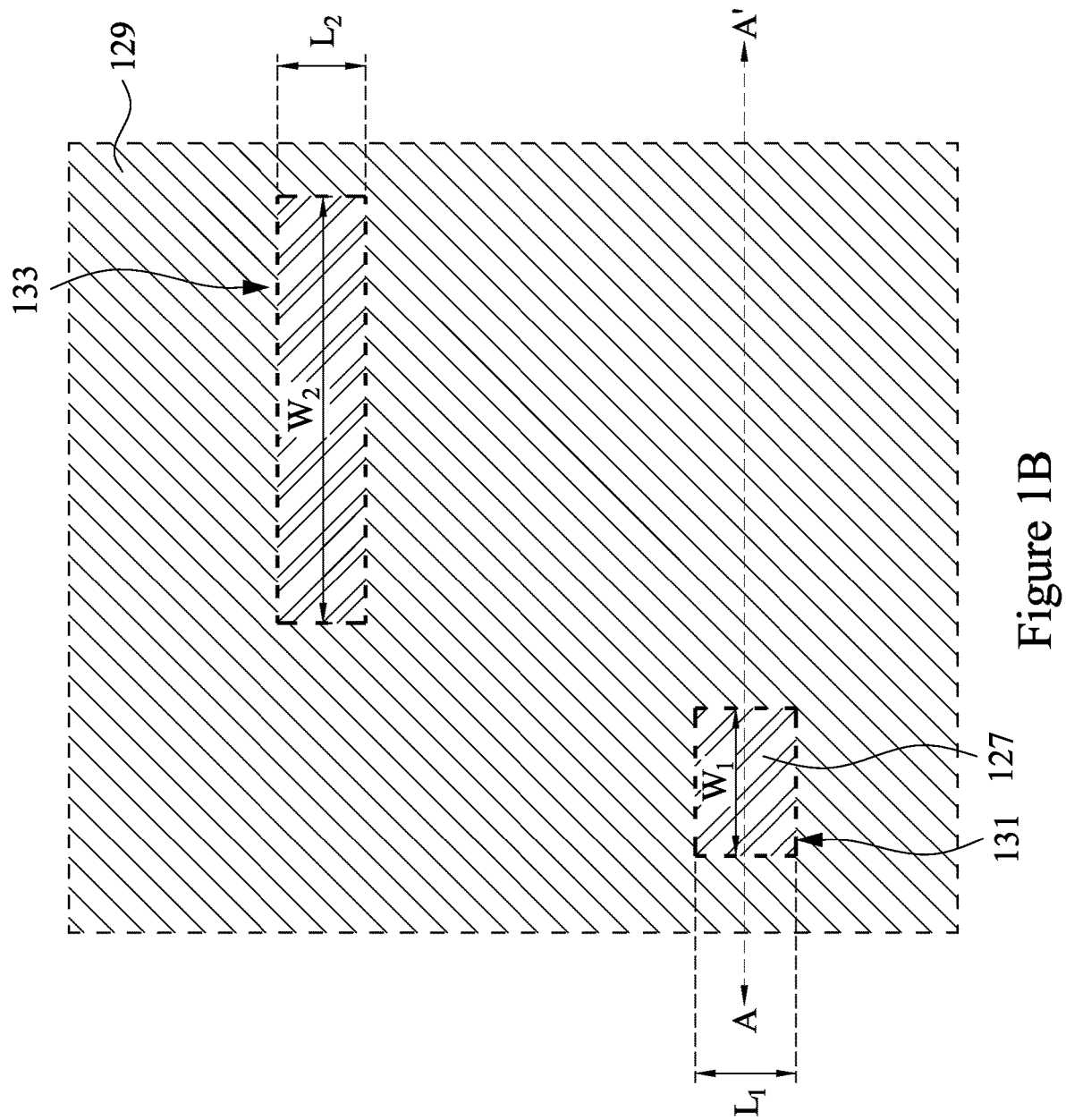

With reference now to FIGS. 1A-1B, in which FIG. 1A is a cross-sectional view of the top down FIG. 1B through line A-A', there is illustrated a first etch stop layer 101 over a conductive element 103 (within a metallization layer 105) over a semiconductor substrate 107. In an embodiment the semiconductor substrate 107 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices 109 may be formed on the semiconductor substrate 107. In an embodiment the active devices 109 may comprise a wide variety of active devices 109 such as transistors (planar, finFET, multi-channel, nanostructure, combinations of these, or the like) and the like and passive devices such as capacitors, resistors, inductors and the like that may be used to generate the desired structural and functional parts of the design. The active devices 109 and passive devices may be formed using any suitable methods either within or else on the semiconductor substrate 107.

The metallization layers 105 are formed over the semiconductor substrate 107 and the active devices 109 and are designed to connect the various active devices 109 to form functional circuitry for the design. In an embodiment the metallization layers 105 are formed of layers of dielectric and conductive material and may be formed through any suitable process (such as deposition, damascene, dual damascene, etc.). In an embodiment there may be a first interlayer dielectric layer (ILD), a first metallization layer with a second ILD and contacts embedded within the second ILD, and a third ILD over the second ILD.

The conductive elements 103 may be formed in an upper portion of the metallization layers 105, and is a region to which first conductive lines 801 (not illustrated in FIG. 1A but illustrated and described below with respect to FIG. 8A]) will make physical and electrical connection. In an embodiment the conductive elements 103 may be a material such as copper formed using, e.g., a damascene or dual damascene process, whereby an opening is formed within an upper portion of the metallization layers 105, the opening is filled and/or overfilled with a conductive material such as copper, and a planarization process is performed to embed the conductive material within the metallization layers 105. However, any suitable material and any suitable process may be used to form the conductive elements 103.

FIG. 1A additionally illustrates the placement of the first etch stop layer 101 over the metallization layers 105. In one embodiment, the first etch stop layer 101 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 101, such as low pressure CVD (LPCVD), PVD, or the like, could alternatively be used. The first etch stop layer 101 may have a thickness of between about 5 Å and about 200 Å or between about 5 Å and about 50 Å.

Once the first etch stop layer 101 has been deposited, a first dielectric layer 115 is deposited over the first etch stop layer 101. The first dielectric layer 115 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first dielectric layer 115 may be formed through a process such as chemical vapor deposition (CVD), although any suitable process may be utilized.

After the first dielectric layer 115 has been deposited, a first layer 117 may be deposited in preparation for additional layers. In an embodiment the first layer 117 may be an oxide material, such as silicon oxide formed using a precursor such as TEOS, other oxides, silicon nitride, other nitrides, combinations of these, or the like, formed using a process such as chemical vapor deposition, physical vapor deposition, atomic layer deposition, combinations of these, or the like. The first layer 117 may be deposited to a thickness of between about 100 Å and about 400 Å. However, any suitable material, method of deposition, and thickness may be utilized.

A first hard mask layer 119 may then be deposited over the first layer 117. The first hard mask layer 119 may be a material that has a sufficient selectivity (based on the etchants used) to the material of the first layer 117, such as a selectivity of the first layer 117 to the first hard mask layer 119 of greater than 3.0. In particular embodiments the first hard mask layer 119 may be a material such as titanium nitride (TiN), titanium oxide (TiO), tungsten doped carbide (WDC), combinations of these, or the like, deposited using a process such as chemical vapor deposition, physical vapor deposition, atomic layer deposition, combinations of these, or the like. Additionally, the material of the first hard mask layer 119 may be deposited to a thickness of between about 100 Å and about 350 Å. However, any suitable material, method of deposition, and thickness may be utilized.

After the first hard mask layer 119 has been deposited, a second layer 121 may be deposited in preparation for additional layers. In an embodiment the second layer 121 may be a material with a sufficient selectivity (based on the desired etchants) to the material of the first hard mask layer 119, such as a selectivity of greater than 5.0. In particular embodiments, the second layer 121 may be an oxide material, such as silicon oxide formed using a precursor such as TEOS, other oxides, silicon nitride, other nitrides, combinations of these, or the like, formed using a process such as chemical vapor deposition, physical vapor deposition, atomic layer deposition, combinations of these, or the like. The second layer 121 may be deposited to a thickness of between about 100 Å and about 400 Å. However, any suitable material, method of deposition, and thickness may be utilized.

Once the second layer 121 has been placed, a first patterning process may be initiated by applying a first photoresist 123 over the second layer 121. In an embodiment the first photoresist 123 may be a tri-layer photoresist with a bottom anti-reflective coating (BARC) layer 125, an first intermediate mask layer 127, and a top photosensitive layer 129. The BARC layer 125 is applied in preparation for an application of the top photosensitive layer 129. The BARC layer 125, as its name suggests, works to prevent the uncontrolled and undesired reflection of energy (e.g., light) back into the overlying top photosensitive layer 129 during an exposure of the top photosensitive layer 129, thereby preventing the reflecting light from causing reactions in an undesired region of the top photosensitive layer 129. Additionally, the BARC layer 125 may be used to provide a planar surface, helping to reduce the negative effects of the energy impinging at an angle.

The first intermediate mask layer 127 may be placed over the BARC layer 125. In an embodiment the first intermediate mask layer 127 is a hard mask material such as silicon nitride, oxides, oxynitrides, silicon carbide, amorphous silicon, combinations of these, or the like. The hard mask material for the first intermediate mask layer 127 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combinations are fully intended to be included within the scope of the embodiments. The first intermediate mask layer 127 may be formed to a thickness of between about 50 Å and about 500 Å, such as about 300 Å.

In an embodiment the top photosensitive layer 129 is applied over the first intermediate mask layer 127 using, e.g., a spin-on process, and includes a photoresist polymer resin along with one or more photoactive compounds (PACs) in a photoresist solvent. The PACs will adsorb the patterned light source and generate a reactant in those portions of the top photosensitive layer 129 that are exposed, thereby causing a subsequent reaction with the photoresist polymer resin that can be developed in order to replicate the patterned energy source within the top photosensitive layer 129.

Once each of the BARC layer 125, the first intermediate mask layer 127, and the top photosensitive layer 129 have been applied, the top photosensitive layer 129 is exposed to a patterned energy source (e.g., light) and developed in order to form a first opening 131 in the top photosensitive layer 129. In an embodiment the first opening 131 within the top photosensitive layer 129 is patterned to have a first width $W_1$ of between about 20 nm and about 200 nm. However, any suitable width may be utilized.

FIG. 1B illustrates a top down view of the first opening 131 through the top photosensitive layer 129 to expose the underlying first intermediate mask layer 127. The first opening 131 (as can be seen in later figures) can be utilized in order to form a single cut portions 803 in first conductive lines 801. As can be seen in this view as well, the first opening 131 has the first width $W_1$, and can additionally have a first length $L_1$ of between about 7 nm and about 20 nm, such as about 14 nm or about 12 nm. However, any suitable dimensions may be utilized.

FIG. 1B also illustrates a second opening 133 which may be formed through the top photosensitive layer 129 to expose the underlying first intermediate mask layer 127. The second opening 133 (as can be seen in later figures) can either be the same as the first opening 131 (just in a different location) or else may be utilized in order to form multiple cut portions 803 in first conductive lines 801 using the same opening (e.g., the second opening 133). In an embodiment the second opening 133 may be formed to have a second width $W_2$ of between about 20 nm and about 200 nm and a second length $L_2$ of between about 7 and about 20 nm. However, any suitable dimensions may be utilized.

Figure 2A:
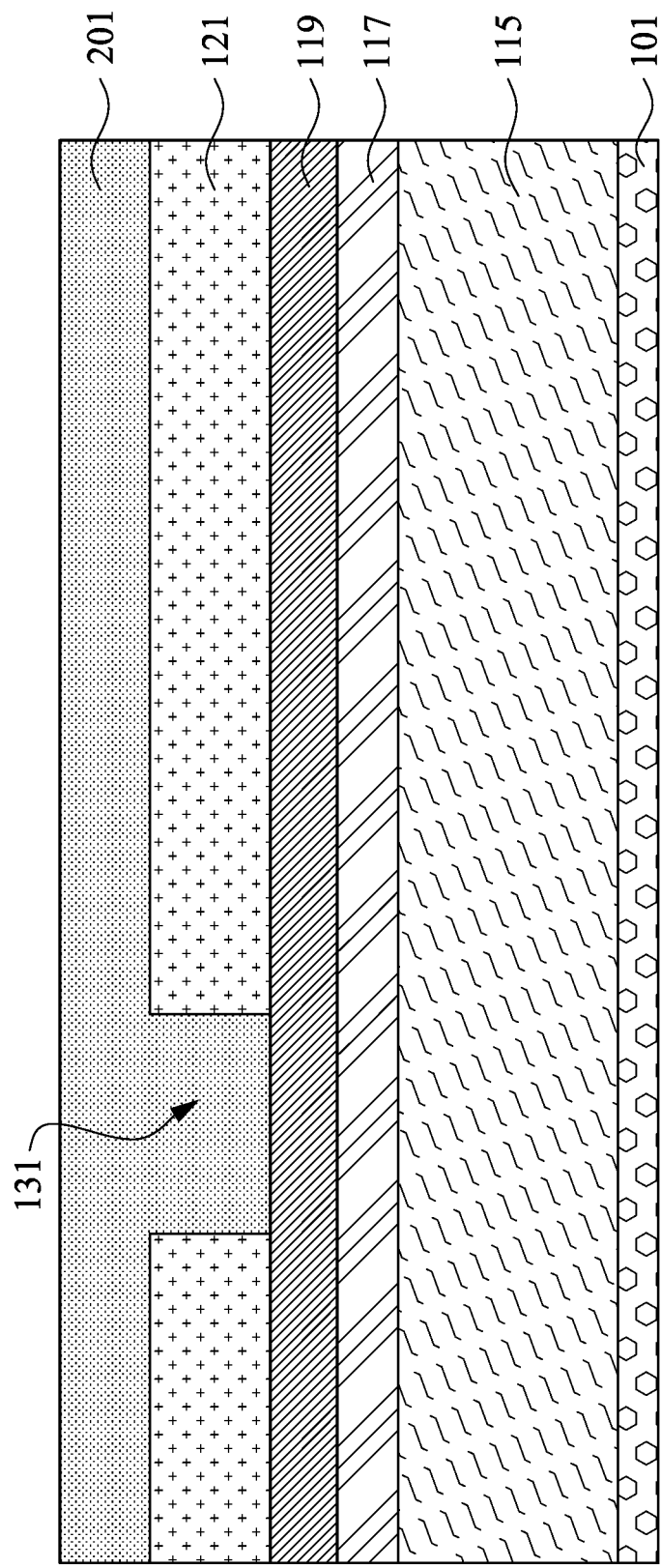
FIGS. 2A-2B illustrate a deposition of a first dielectric material, in accordance with some embodiments.
Figure 2B:
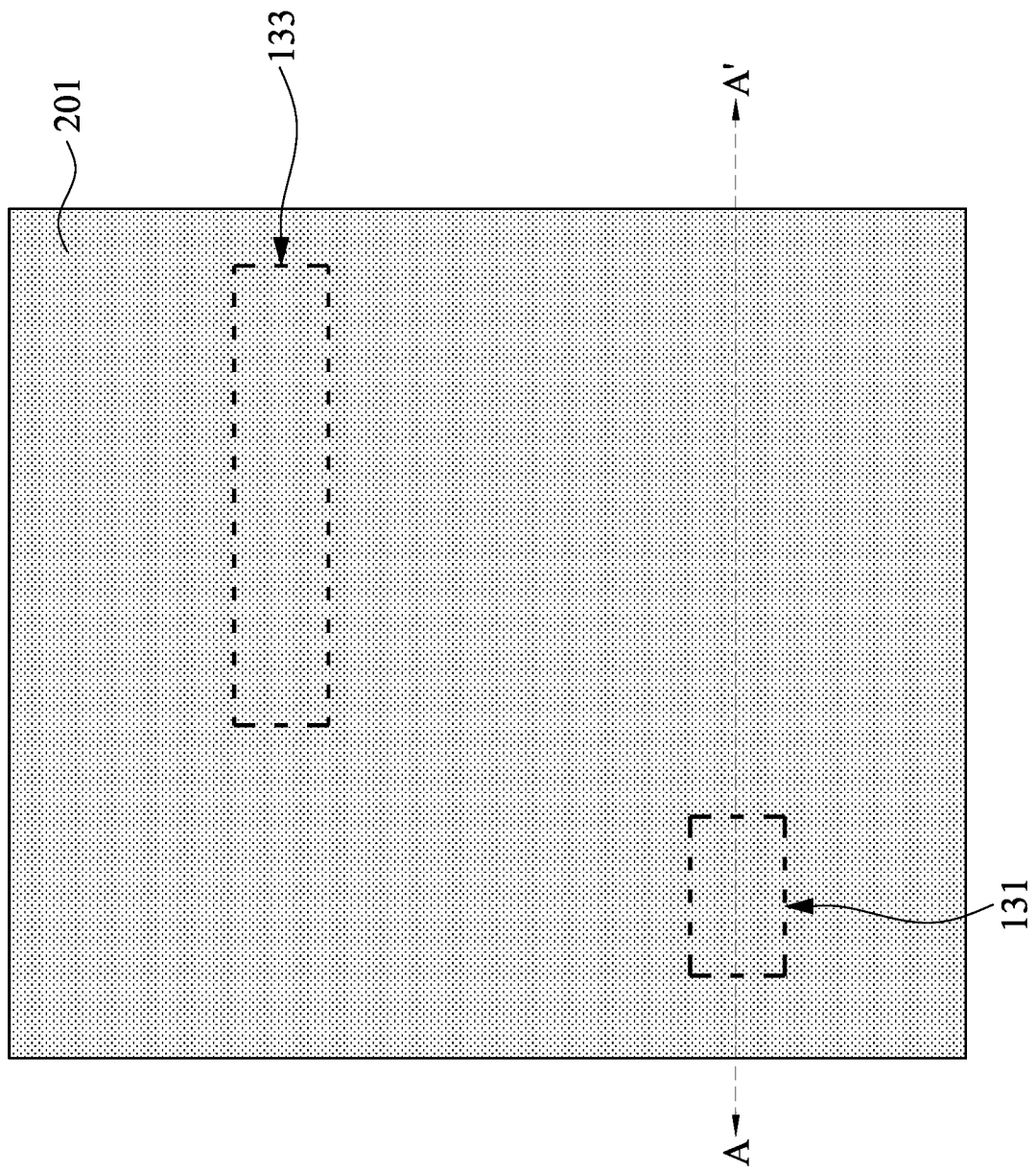

FIGS. 2A-2B illustrate a patterning of the second layer 121 using the photoresist 123 as a mask, in which FIG. 2A is a cross-sectional view of the top down FIG. 2B through line A-A'. For clarity, all of the structures located below the first etch stop layer 101 have been removed from the figures. In an embodiment the top photosensitive layer 129 is utilized as a mask along with one or more etching processes, such as reactive ion etching processes, in order to sequentially etch through the first intermediate mask layer 127 and the BARC layer 125, before extending the first opening 131 and the second opening 133 into the second layer 121. As such, by extending the first opening 131 and the second opening 133 into the second layer 121, the first opening 131 and the second opening 133 within the second layer 121 will have similar dimensions as the first opening 131 and the second opening 133 within the top photosensitive layer 129. However, any suitable dimensions may be utilized.

FIGS. 2A-2B additionally illustrate that, during the patterning of the first intermediate mask layer 127, and/or the BARC layer 125, and/or the second layer 121, the top photosensitive layer 129 may be consumed. For example, the etchants utilized for the patterning of the first intermediate mask layer 127, and/or the BARC layer 125, and/or the second layer 121 may also etch the top photosensitive layer 129, although at a smaller rate. As such, while the top photosensitive layer 129 is still used as a mask, by the end of the patterning of the second layer 121 the top photosensitive layer 129 may be fully removed. If not, an optional ashing process may be utilized to remove the top photosensitive layer 129. However, any other suitable process may be utilized in order to remove the top photosensitive layer 129.

Additionally, once the top photosensitive layer 129 has been removed, the first intermediate mask layer 127 and the BARC layer 125 may be removed. In an embodiment the first intermediate mask layer 127 and the BARC layer 125 may be removed using one or more etches, such as wet etches or dry etches, that utilize etchants that are selective to the materials of the first intermediate mask layer 127 and the BARC layer 125. However, any suitable method for removing the first intermediate mask layer 127 and the BARC layer 125 may be utilized.

Finally, once the BARC layer 125 has been removed and the underlying second layer 121 has been exposed (with the first opening 131 and the second opening 133 being located within the second layer 121), a first dielectric material 201 is deposited to fill and/or overfill the first opening 131 and the second opening 133. In an embodiment the first dielectric material 201 may be a material which has a etching selectivity to the material of the underlying second layer 121 and to the material of the underlying first hard mask layer 119 of greater than 5.0, such as greater than 30, such as titanium oxide, titanium nitride, silicon nitride, combinations of these, or the like, and may be deposited using atomic layer deposition, physical vapor deposition, chemical vapor deposition, combinations of these, or the like. The first dielectric material 201 may be deposited to a thickness of between about 50 Å and about 200 Å. However, any suitable material, method of deposition, and thickness may be utilized.

FIG. 2B illustrates the deposition of the first dielectric material 201 in the top down view. While the first dielectric material 201 is deposited to cover the entire top surface of the second layer 121, for convenience the first opening 131 and the second opening 133 are illustrated as underlying features using dashed boxes. As can be seen, the first opening 131 and the second opening 133 within the second layer 121 retain (within etching limits) the shape and size that the first opening 131 and the second opening 133 had in the top photosensitive layer 129.

Figure 3A:
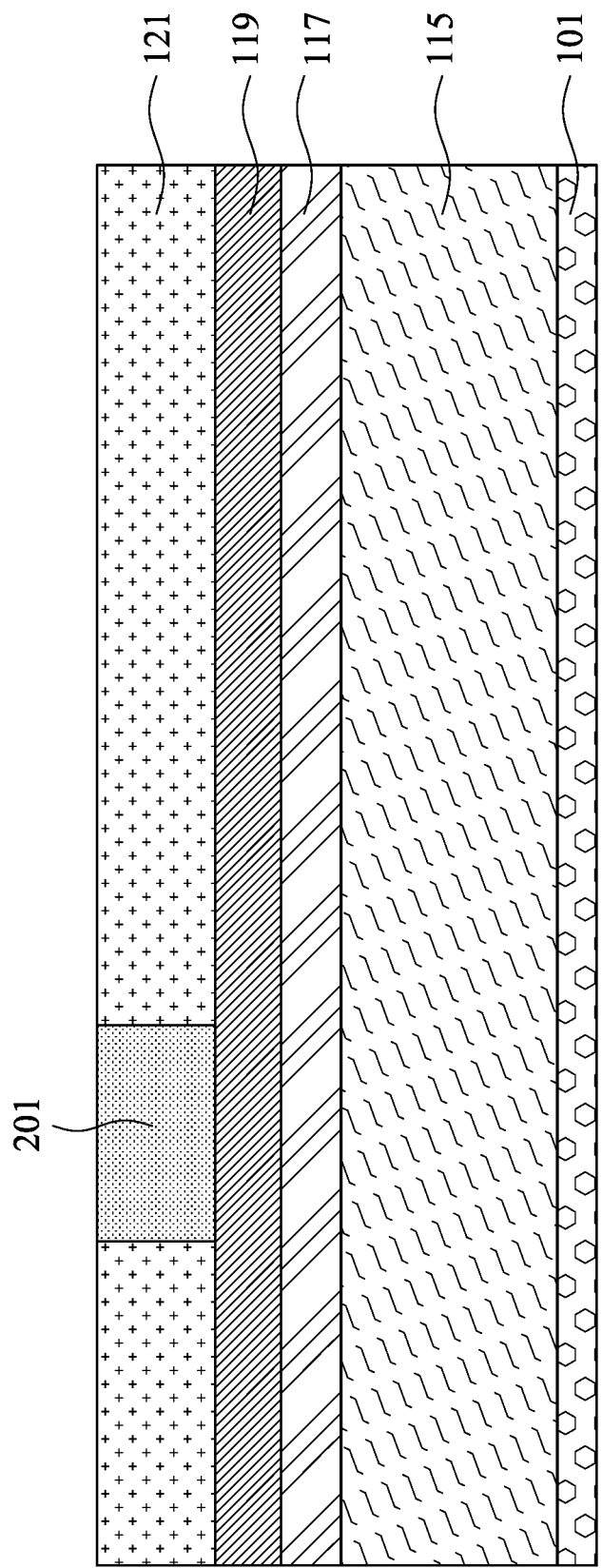
FIGS. 3A-3B illustrate a planarization of the first dielectric material, in accordance with some embodiments.
Figure 3B:
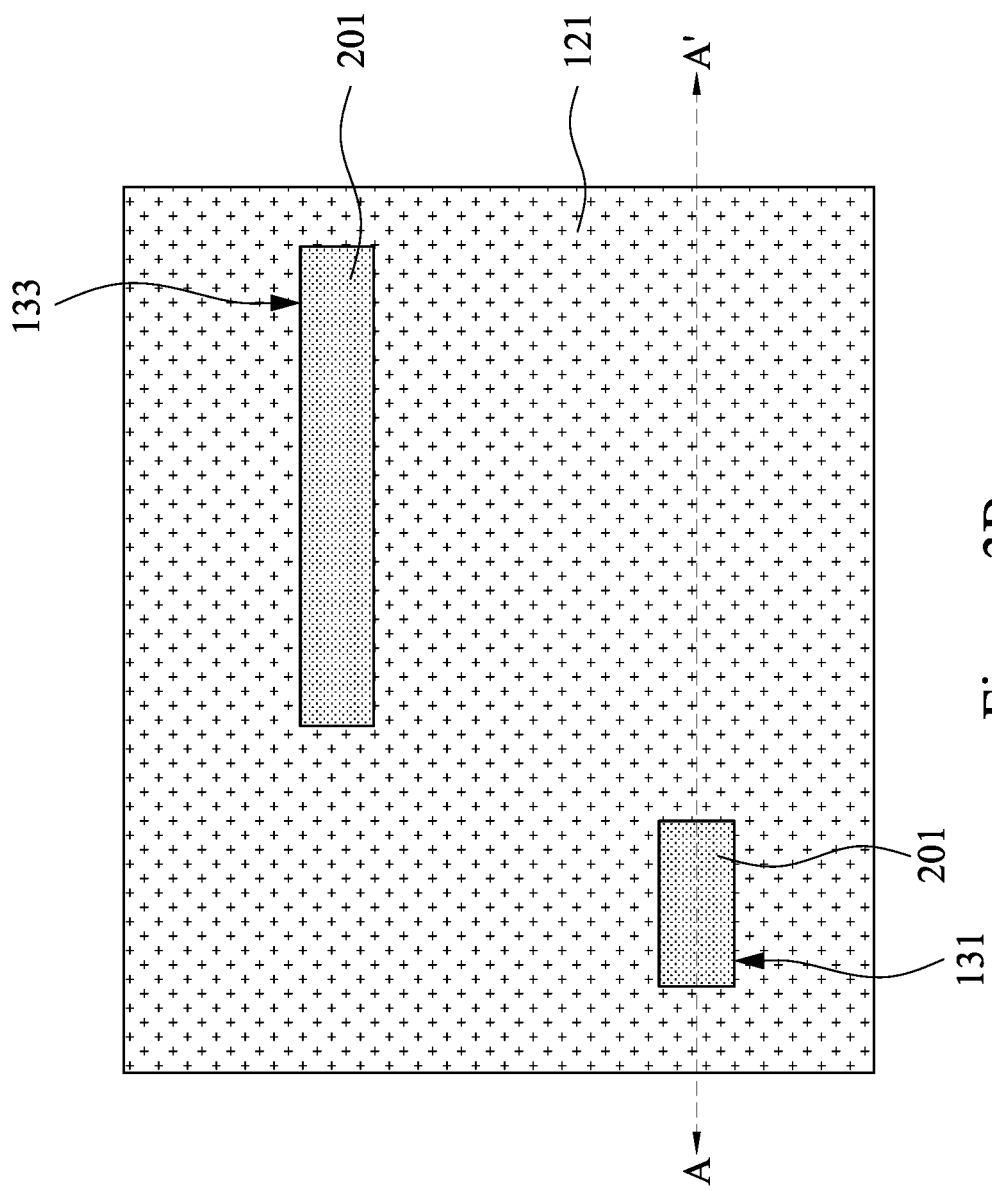

FIGS. 3A-3B illustrate that, once the first opening 131 and the second opening 133 have been filled and/or over-filled with the first dielectric material 201, the first dielectric material 201 is planarized with the second layer 121, in which FIG. 3A is a cross-sectional view of the top down FIG. 3B through line A-A'. In an embodiment in which the first dielectric material 201 is titanium oxide, the first dielectric material 201 may be planarized using an etch back process, such as a gaseous etch back using an etchant or combination of etchants such as methane ($CH_4$), chlorine ($Cl_2$), tetrafluorocarbon ($CF_4$), hydrogen bromide (HBr), combinations of these, or the like, along with any desired diluents or carrier gases such as argon and nitrogen. However, any etchants and/or diluents may be utilized.

However, the etch back process described above is not the only planarization process that may be utilized. In other embodiments the planarization process may be performed using a chemical mechanical polishing process or a grinding process in order to planarize the first dielectric material 201 with the second layer 121. Any suitable planarization process may be used in order to remove excess portions of the first dielectric material 201 and planarize the first dielectric material 201 with the second layer 121.

In one particular embodiment in which the second layer 121 is an oxide which uses TEOS as a precursor with a thickness of about 250 Å and the first hard mask layer 119 is a carbon doped tungsten material with a thickness of about 180 Å, the first dielectric material 201 may be a material such as titanium oxide with a thickness (after planarization) of about 100 Å. In another particular embodiment in which the second layer 121 is a nitride such as silicon nitride with a thickness of about 250 Å and the first hard mask layer 119 is a carbon doped tungsten material with a thickness of about 180 Å, the first dielectric material 201 may be a material such as titanium oxide with a thickness (after planarization) of about 100 Å. However, any suitable combination of materials and any suitable thickness may be utilized.

FIG. 3B illustrates the planarization of the first dielectric material 201 in the top down view. As can be seen, after the planarization the first opening 131 and the second opening 133 within the second layer 121 are filled with the first dielectric material 201, and the first dielectric material 201 within the first opening 131 and the second opening 133 take on the shape and size of the first opening 131 and the second opening 133.

Figure 4A:
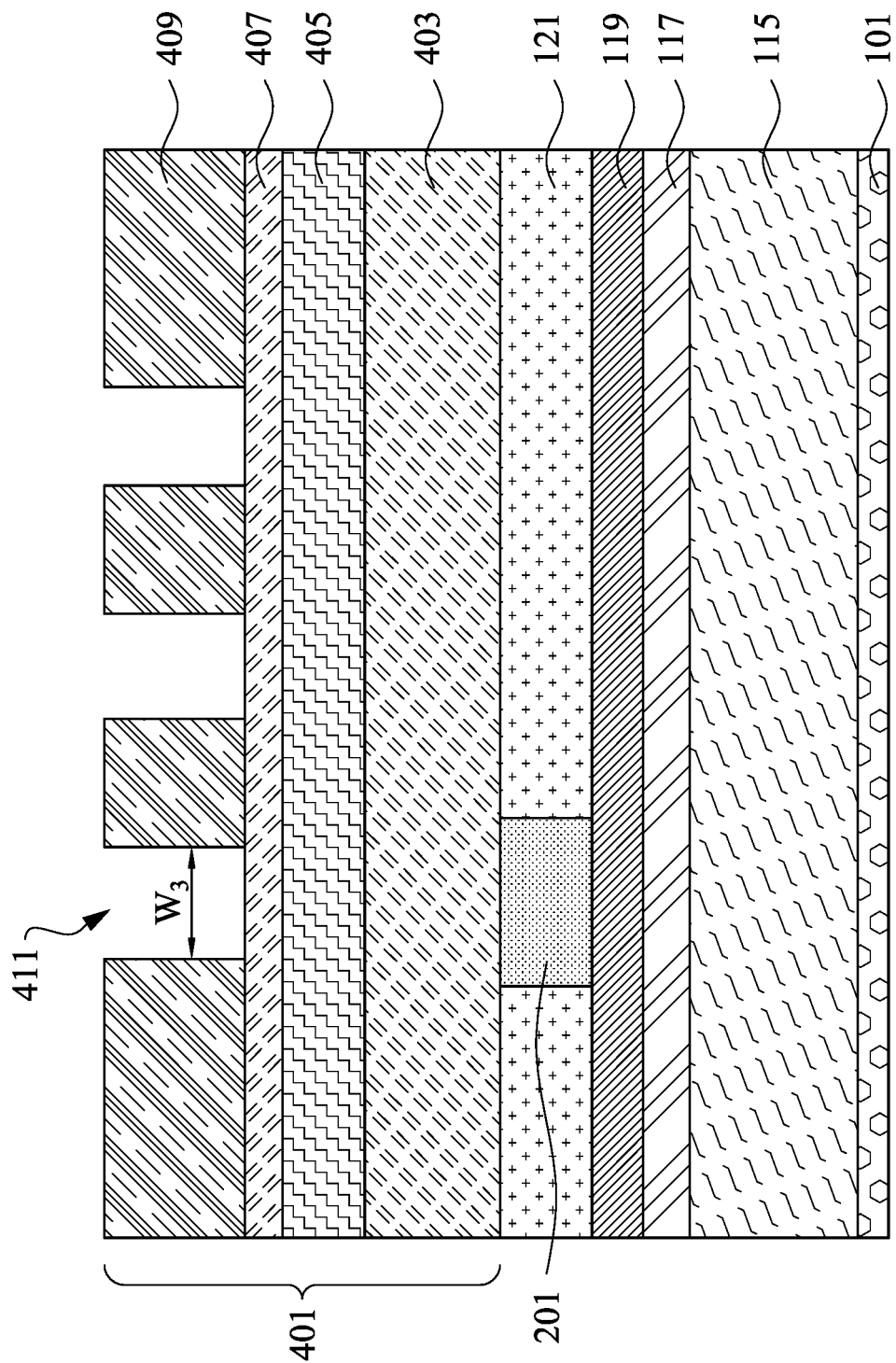
FIGS. 4A-4B illustrate a patterning of a second photoresist, in accordance with some embodiments.
Figure 4B:
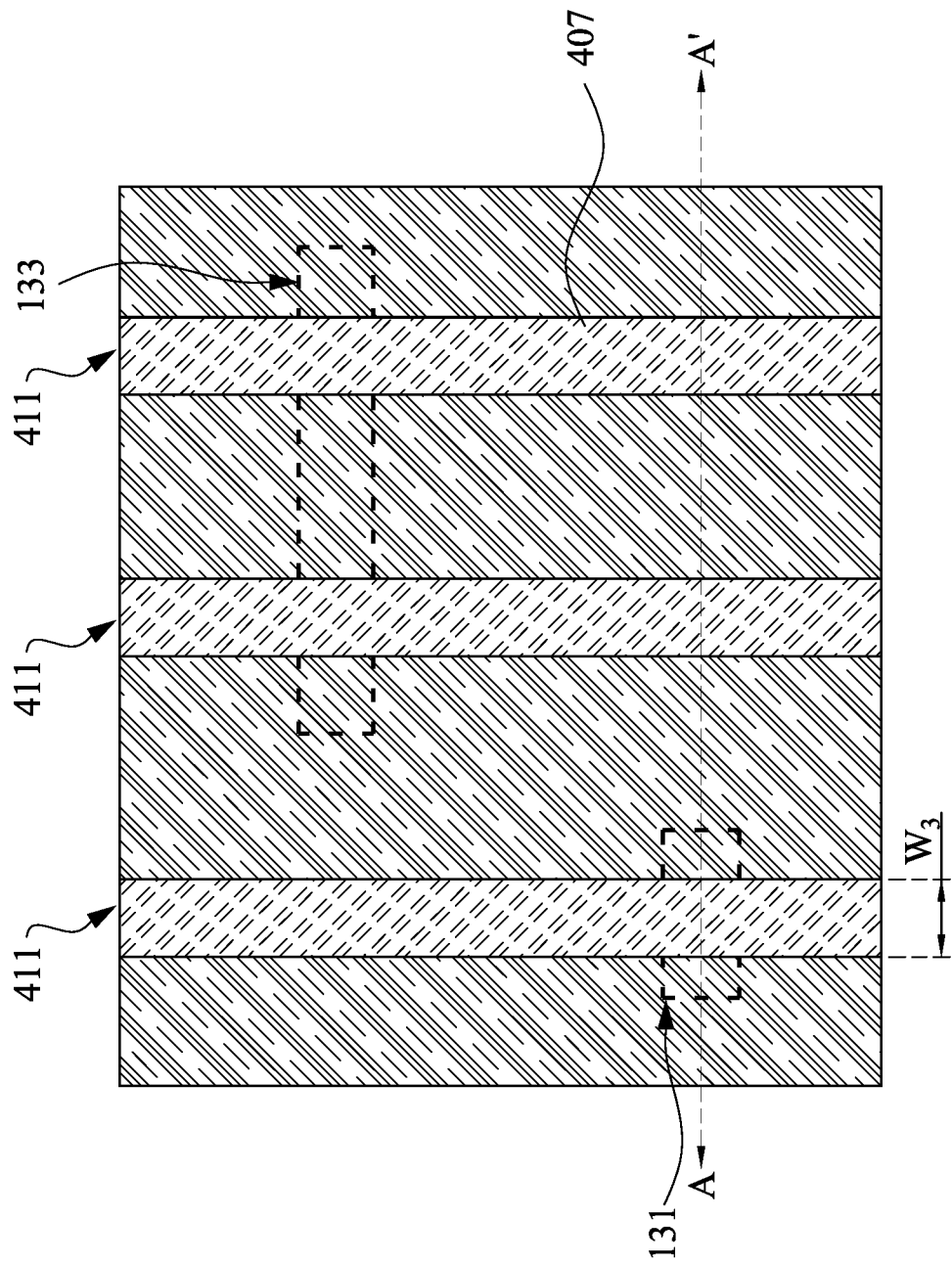

FIGS. 4A-4B illustrate the initiation of a second patterning process that is utilized to pattern the second layer 121, in which FIG. 4A is a cross-sectional view of the top down FIG. 4B through line A-A'. In the second patterning process a second photoresist 401 is placed and patterned over the second layer 121 with the first dielectric material 201 embedded within the second layer 121. In an embodiment the second photoresist 401 is designed for an extreme ultraviolet (EUV) light exposure and may be, e.g., a tetralayer photoresist, wherein the second photoresist 401 comprises a second BARC layer 403, a second intermediate mask layer 405, a third BARC layer 407, and a second top photosensitive layer 409. However, any suitable photoresist and any suitable number of layers may be utilized.

The second BARC layer 403 is applied in preparation for an application of the second top photosensitive layer 409. The second BARC layer 403, as its name suggests, works to prevent the uncontrolled and undesired reflection of energy (e.g., light) back into the overlying second top photosensitive layer 409 during an exposure of the second top photosensitive layer 409, thereby preventing the reflecting light from causing reactions in an undesired region of the second top photosensitive layer 409. Additionally, the second BARC layer 403 may be used to provide a planar surface, helping to reduce the negative effects of the energy impinging at an angle.

The second intermediate mask layer 405 may be placed over the second BARC layer 403. In an embodiment the second intermediate mask layer 405 is a hard mask material such as silicon nitride, oxides, oxynitrides, silicon carbide, combinations of these, or the like. The hard mask material for the second intermediate mask layer 405 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combinations are fully intended to be included within the scope of the embodiments. The second intermediate mask layer 405 may be formed to a thickness of between about 100 Å and about 800 Å, such as about 300 Å.

Additionally, in embodiments in which the second intermediate mask layer 405 is deposited with a chemical vapor deposition process (e.g., when CVD is utilized to help improve the etch selectivity of the second intermediate mask layer 405), adhesion between the second intermediate mask layer 405 and the desired overlying second top photosensitive layer 409 may degrade. As such, the third BARC layer 407 is deposited in order to improve the adhesion between the second intermediate mask layer 405 and the overlying second top photosensitive layer 409. In an embodiment the third BARC layer 407 may be similar to the second BARC layer 403, although in other embodiments, the third BARC layer 407 may be different.

The second top photosensitive layer 409 is applied over the third BARC layer 407 using, e.g., a spin-on process, and includes a photoresist polymer resin along with one or more photoactive compounds (PACs) in a photoresist solvent. The PACs will adsorb the patterned light source and generate a reactant in those portions of the second top photosensitive layer 409 that are exposed, thereby causing a subsequent reaction with the photoresist polymer resin that can be developed in order to replicate the patterned energy source within the second top photosensitive layer 409.

Once each of the second BARC layer 403, the second intermediate mask layer 405, the third BARC layer 407 and the second top photosensitive layer 409 have been applied, the second top photosensitive layer 409 is exposed to a patterned energy source (e.g., light such as an extreme ultraviolet (EUV) light) and developed in order to form third openings 411 (e.g., line openings) in the second top photosensitive layer 409. In an embodiment the third openings 411 within the second top photosensitive layer 409 are patterned to have a third width $W_3$ of between about 20 nm and about 200 nm. However, any suitable width may be utilized.

FIG. 4B illustrates a top down view of the third openings 411 through the second top photosensitive layer 409 to expose the underlying third BARC layer 407. As can be seen in this view as well, the first opening 131 has the third width $W_3$ (which may be less than the first width $W_1$). Additionally, the third openings 411 may extend a length that is desired for routing conductive lines, which may extend beyond the view of FIG. 4B. However, any suitable dimensions may be utilized.

FIG. 4B also illustrates that the third openings 411 may be formed in different ways. For example, a first one of the third openings 411 may be formed over the first dielectric material 201 within the first opening 131, and this first one of the third openings 411 may be the only third opening 411 formed over the first dielectric material 201 within the first opening 131. However, a second one and a third one of the third openings 411 may be formed over the first dielectric material 201 within the second opening 133, so that there are multiple third openings 411 over the same section of the first dielectric material 201 within the second opening 133. Any suitable combination of third openings 411 over the first dielectric material 201 within underlying openings may be utilized, and all such combinations are fully intended to be included within the scope of the embodiments.

Figure 5A:
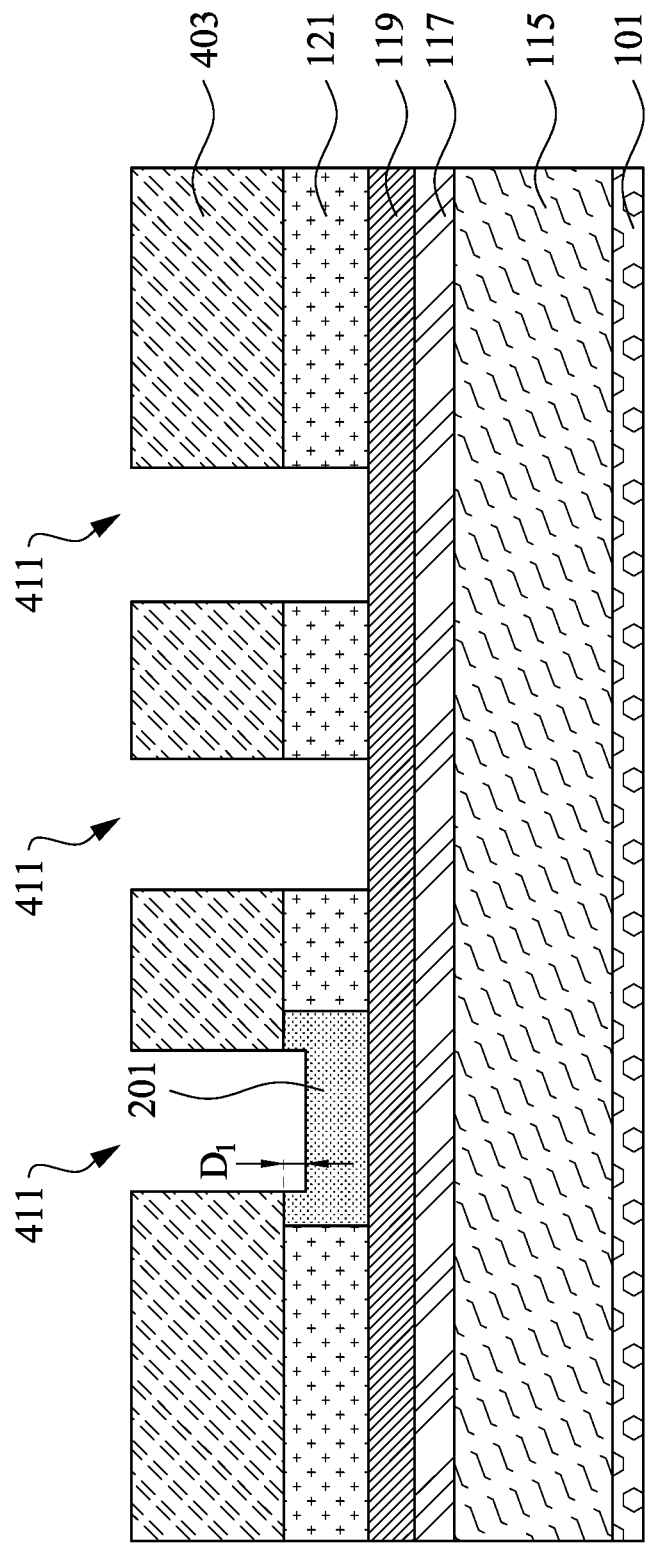
FIGS. 5A-5B illustrate a patterning a first interfacial layer, in accordance with some embodiments.
Figure 5B:
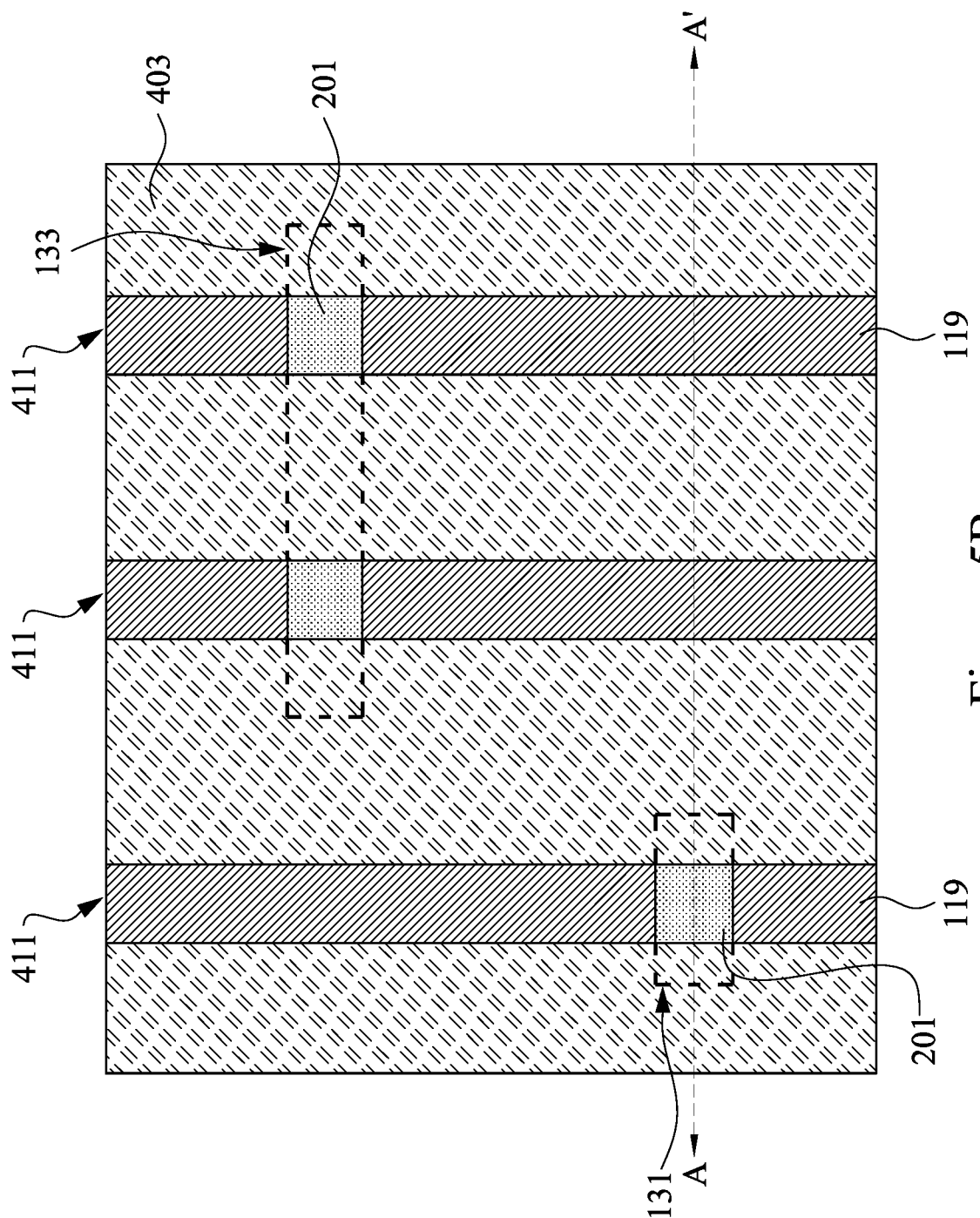

FIGS. 5A-5B illustrate a patterning of the second layer 121 using the second photoresist 401 as a mask, in which FIG. 5A is a cross-sectional view of the top down FIG. 5B through line A-A'. In an embodiment the second top photosensitive layer 409 is utilized as a mask along with one or more etching processes, such as reactive ion etching processes, in order to sequentially etch through the third BARC layer 407, the second intermediate mask layer 405, and the second BARC layer 403.

Additionally, once the second BARC layer 403 has been patterned, the third openings 411 may be extended into the second layer 121. In a particular embodiment in which the second layer 121 is an oxide formed using TEOS, the extension may be performed using, e.g., a reactive ion etching process that utilizes etchants such as $CF_4$, $CHF_3$, $CH_2F_2$, and $C_4F_6$, along with any other desired diluents and/or carrier gases, such as argon, nitrogen, and/or helium. As such, by extending the third openings 411 into the second layer 121, the third openings 411 within the second layer 121 will have similar dimensions as the third openings 411 within the second top photosensitive layer 409. However, any suitable dimensions may be utilized.

FIGS. 5A-5B additionally illustrate that, during the patterning of either the third BARC layer 407, the second intermediate mask layer 405, the second BARC layer 403, and/or the second layer 121, the second top photosensitive layer 409 may be consumed. For example, the etchants utilized for the patterning of the third BARC layer 407, the second intermediate mask layer 405, the second BARC layer 403, and/or the second layer 121 may also etch the second top photosensitive layer 409, although at a smaller rate. As such, the second top photosensitive layer 409 is still used as a mask, although by the end of the patterning of the second layer 121 the second top photosensitive layer 409 may be fully removed. If not, an optional ashing process may be utilized to remove the second top photosensitive layer 409. However, any other suitable process may be utilized in order to remove the second top photosensitive layer 409.

Additionally, once the second top photosensitive layer 409 has been removed, the third BARC layer 407 and the second intermediate mask layer 405 may be removed. In an embodiment the third BARC layer 407 and the second intermediate mask layer 405 may be removed using one or more etches, such as wet etches or dry etches, that utilize etchants that are selective to the materials of the third BARC layer 407 and the second intermediate mask layer 405. However, any suitable method for removing the third BARC layer 407 and the second intermediate mask layer 405 may be utilized.

Additionally, as best seen in FIG. 5A, in those places where the first dielectric material 201 is already present, the extension of the third openings 411 through the second layer 121 is reduced or eliminated completely, such that the third openings 411 are prevented from extending all of the way through the second layer 121. For example, in some embodiments the second patterning process may etch into the dielectric material 201 a first distance $D_1$ of between about 0 nm and about 10 nm. However, any suitable depth, including a depth of zero, may be utilized.

FIG. 5B illustrates a top down view of the third openings 411 after the third openings 411 have been extended through the second BARC layer 403 and the second layer 121 to expose either the underlying first dielectric material 201 or else the underlying first hard mask layer 119. As can be seen in this view, those portions of the third openings 411 located over the exposed portions of the first hard mask layer 119 have a desired shape (in the top down view) of the desired first conductive lines 801, while those portions of the third openings 411 located over the first dielectric material 201 have a desired shape (in the top down view) of desired "cuts" 803 in the first conductive lines 801.

Figure 6A:
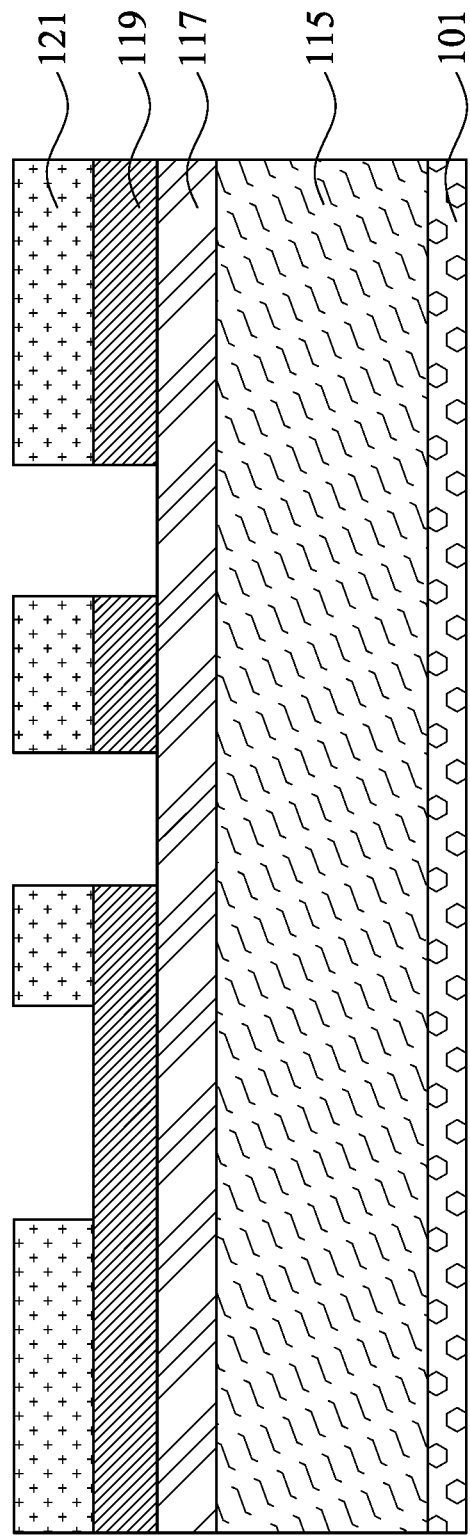
FIGS. 6A-6B illustrate a patterning of a hard mask layer, in accordance with some embodiments.
Figure 6B:
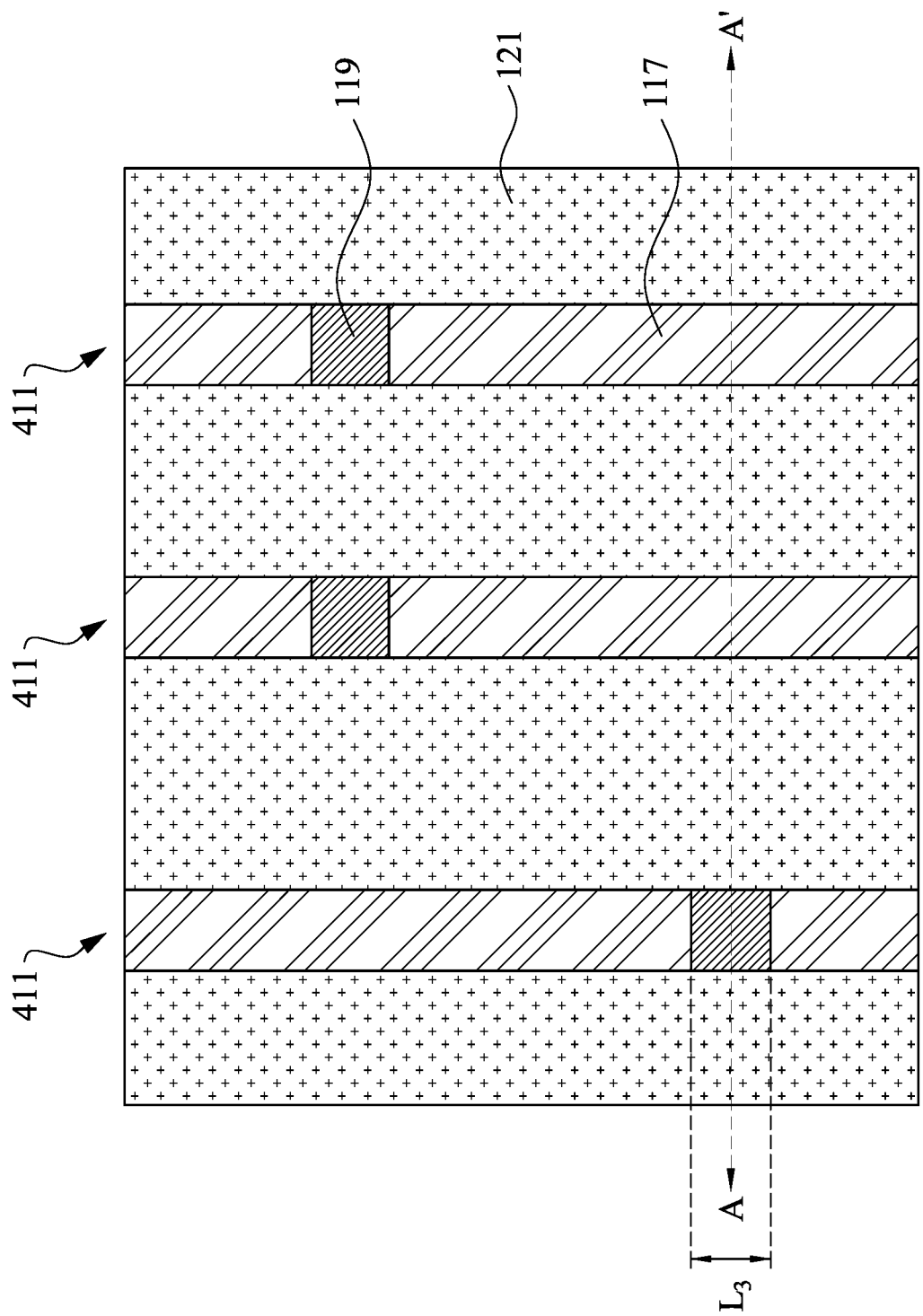

FIGS. 6A-6B illustrate that, once the third openings 411 have been extended through the second layer 121 (except for those portions of the third openings 411 overlying the first dielectric material 201), the underlying first hard mask layer 119 may be patterned using the second layer 121 as a mask, in which FIG. 6A is a cross-sectional view of the top down FIG. 6B through line A-A'. In an embodiment the first hard mask layer 119 may be patterned using an anisotropic etching process, such as a reactive ion etch, using etchants selective to the first hard mask layer 119. In a particular embodiment in which the first hard mask layer 119 is a carbon doped tungsten, the first hard mask layer 119 may be patterned with a combination of etchants which includes nitrogen trifluoride ($NF_3$), chlorine ($Cl_2$), and oxygen ($O_2$), which may or may not be diluted with diluents or carrier gases such as argon, nitrogen, or helium. However, any suitable etchants, and any suitable processes, may be utilized.

Additionally, in some embodiments the patterning of the first hard mask layer 119 will also remove the first dielectric material 201 that was previously embedded within the second layer 121. In other embodiments in which the patterning of the first hard mask layer 119 does not remove, or does not fully remove, the material of the first dielectric material 201, a separate etching process, such as a wet etching process or a dry etching process with etchants selective to the material of the first dielectric material 201, may be utilized in order to remove the first dielectric material 201. Any suitable method may be utilized.

However, by having the first dielectric material 201 present during the patterning of the first hard mask layer 119, portions of the first hard mask layer 119 that are covered by the first dielectric material 201 are protected from the etching process at least until the first dielectric material 201 is fully removed. As such, those portions of the first hard mask layer 119 remain in place, even though the third openings 411 were present over the first dielectric material 201.

FIG. 6B illustrates this process in the top down view. As can be seen, the third openings 411 are formed within the second layer 121 in the desired shape of the first conductive lines 801. Further, within the third openings 411 those locations that were not protected by the first dielectric material 201 are etched to expose the underlying first layer 117. However, those locations within the third openings 411 that were protected by the first dielectric material 201 are etched to expose only the first hard mask layer 119 and to not expose the first layer 117. As such, the first hard mask layer 119 is still present where the later-formed first conductive lines 801 are desired to be separated from each other (e.g., "cut"), and may have a third length $L_3$ of between about 5 nm and about 20 nm, such as about 12 nm.

Figure 7:
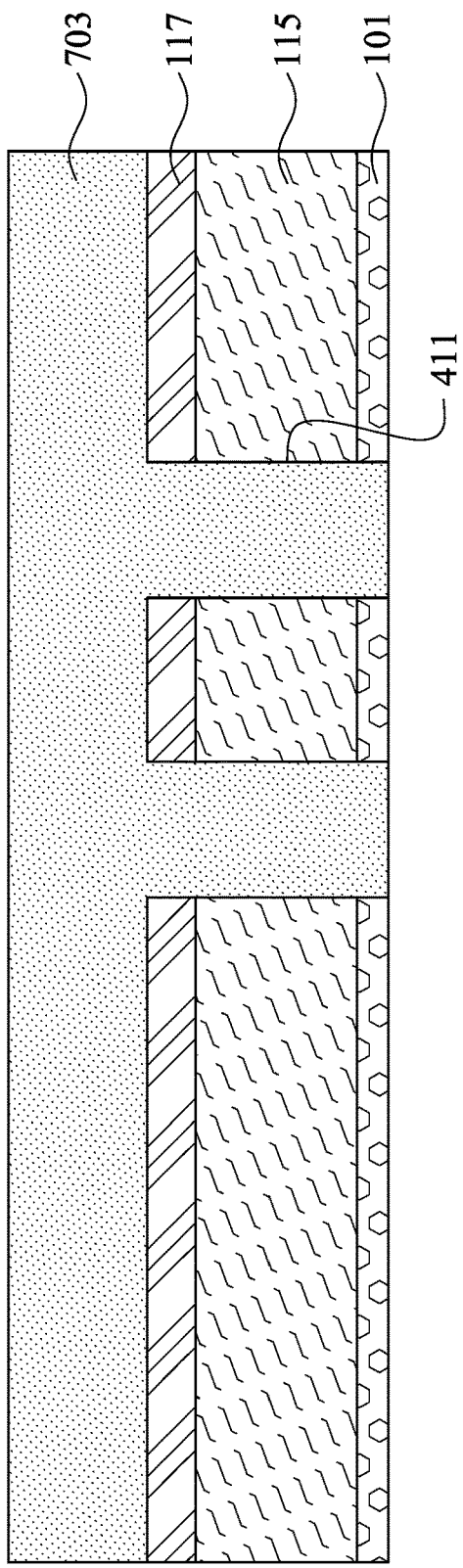
FIG. 7 illustrates a deposition of conductive material, in accordance with some embodiments.

FIG. 7 illustrates that, once the first hard mask layer 119 has been patterned, the first hard mask layer 119 is utilized to extend the third openings 411 through the first layer 117, the first dielectric layer 115, and the first etch stop layer 101. In an embodiment the third openings 411 may be extended through the first layer 117 using, e.g., one or more anisotropic etching processes, such as reactive ion etching processes, and wet etching processes, with etchants that are selective to the material of the first layer 117. However, any suitable process may be utilized.

Once the third openings 411 have been extended through the first layer 117, the first layer 117 (along with the first hard mask layer 119, if still present), are used as a mask to extend the third openings 411 into and/or through the first dielectric layer 115, thereby forming openings for the conductive lines 801 on both sides of that portion of the first dielectric layer 115 that was protected by the first dielectric material 201. In an embodiment the third openings 411 may be extended using, e.g., one or more anisotropic etching processes, such as reactive ion etching processes, with etchants that are selective to the material of the first dielectric layer 115. However, any suitable process may be utilized.

Finally, once the third openings 411 have been extended through the first dielectric layer 115, the first dielectric layer 115 and the first layer 117 (along with the first hard mask layer 119, if still present), are used as a mask in order to extend the third openings 411 into and/or through the first etch stop layer 101 in order to expose underlying portions of the conductive elements 103 (not separately illustrated in FIG. 7).

FIG. 7 additionally illustrates that, once the third openings 411 have been extended to expose portions of the underlying conductive elements 103, a first conductive material 703 is deposited to fill and/or overfill the third openings 411. In an embodiment the first conductive material 703 may comprise a first barrier layer and a conductive fill material. The first barrier layer may be deposited in order to help isolate and protect the subsequently formed conductive fill material. In an embodiment the first barrier layer may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer may be formed to have a thickness of between about 0.1 µm and about 20 µm, such as about 0.5 µm.

Once the first barrier layer has been formed, the third openings 411 are filled with the conductive fill material. The conductive fill material may comprise copper, although other suitable materials such as aluminum, alloys, doped polysilicon, combinations thereof, and the like, may be utilized. The conductive fill material may be formed by depositing a seed layer (not separately illustrated), electroplating copper onto the seed layer, and filling and overfilling the third openings 411. However, any suitable conductive material, or combination of conductive materials, may be utilized.

Figure 8A:
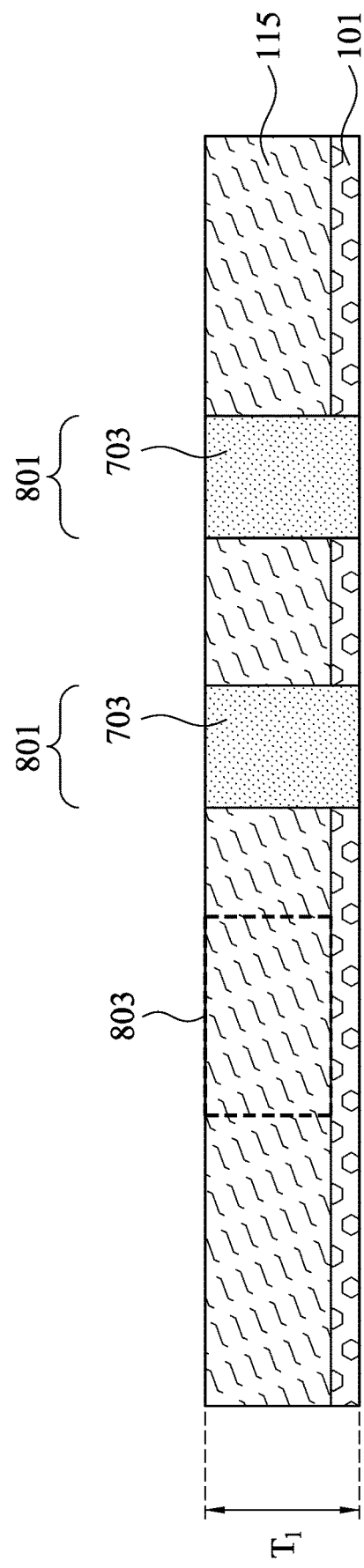
FIGS. 8A-8B illustrates a planarization of the conductive material, in accordance with some embodiments.
Figure 8B:
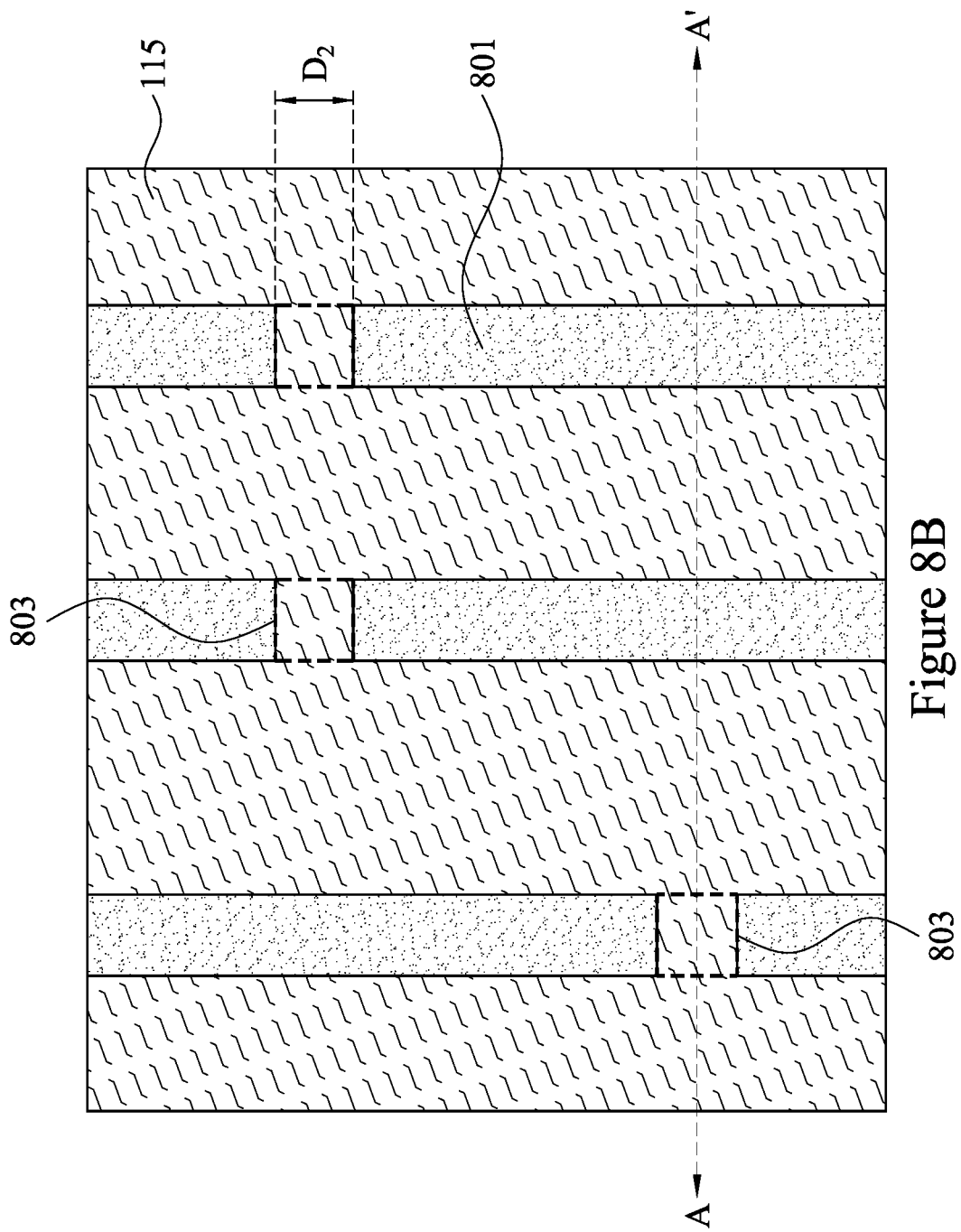

FIGS. 8A-8B illustrate that, after the first conductive material 703 has been deposited to fill and/or overfill the third openings 411, the first conductive material 703 may be planarized with the first dielectric layer 115, in which FIG. 8A is a cross-sectional view of the top down FIG. 8B through line A-A'. In an embodiment the first conductive material 703 may be planarized with a planarization process such as chemical mechanical polishing, grinding, etch back processes, combinations of these, or the like, to a first thickness $T_1$ of between about 100 nm and about 450 nm. Additionally, the planarization process may also remove the first layer 117 to expose a top surface of the first dielectric layer 115. However, any suitable processes may be utilized.

By forming the third openings 411 through the first dielectric layer 115, filling the third openings 411 with the first conductive material 703, and then planarizing the first conductive material 703, first conductive lines 801 are formed in electrical connection with the underlying conductive elements 103. As such, a single damascene formation of the first conductive lines 801 is performed in order to electrically connect the conductive elements 103 with subsequently formed overlying elements.

FIG. 8B illustrates a top down view of the first conductive lines 801 in FIG. 8A. As can be seen in this figure, the first conductive lines 801 are formed as desired in the first dielectric layer 115. However, by utilizing the first dielectric material 201 as a mask to help protect certain portions of the first hard mask layer 119, cut portions (represented in FIG. 8B by the dashed section labeled 803, even through there may not be a physical indication of a separation) of the first dielectric layer 115 are present between different sections of the first conductive lines 801.

However, because the cut portions 803 are created using the process described above (e.g., by using a first patterning process and then placing the first dielectric material 201), the cut portions 803 can have a second distance $D_2$ that is much less than was possible in previous processes. For example, while previous processes could not even reach a second distance $D_2$ of 15 nm, the use of the processes described herein allows for the second distance $D_2$ to be shrunk to less than 15 nm, such as 12 nm or less.

Additionally, by using the processes described, other, undesired shapes that other processes can cause can be avoided. In particular, in some processes a cut of the first conductive lines 801 can result in irregular shapes, such as a bird's beak shape or a horn defect, to occur. Such irregularities can cause additional problems in later manufacturing processes. As such, by removing such irregular shapes, and creating the first conductive lines 801 with regular shapes, the overall manufacturing process can be simplified and better controlled.

Figure 9A:
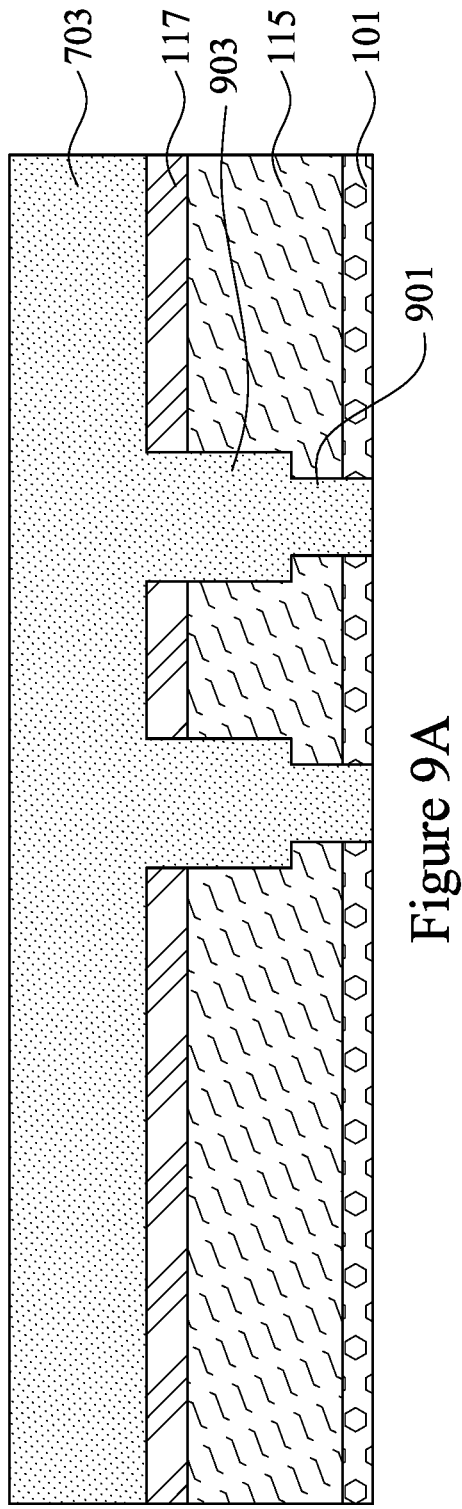
FIGS. 9A-9B illustrate a dual damascene process, in accordance with some embodiments.
Figure 9B:
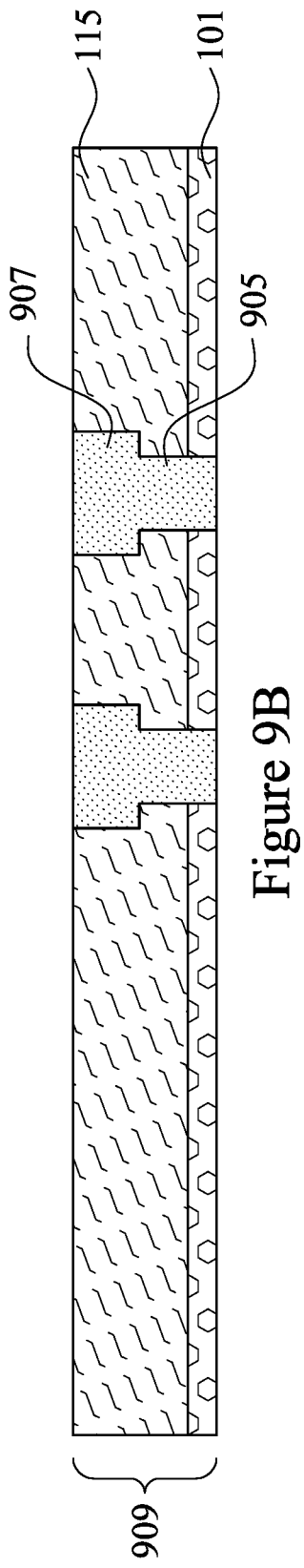

FIGS. 9A-9B illustrate another process that may be used along with the second layer 121 in order to make the first conductive lines 801 (along with their corresponding cut portions 803) along with conductive connections to the underlying conductive elements 103. In this embodiment, however, instead of using the second layer 121 to form a single sized opening for the first conductive lines 801 in a single damascene process, a dual damascene process is utilized, in order to form both second vias 905 as well as second conductive lines 907.

In this embodiment, and looking first at FIG. 9A, via openings 901 and trench openings 903 are formed in the first dielectric layer 115 using the second layer 121 as a mask, in either a via first process or a trench first process. For example, in a via first process, a first photolithographic masking and etching process is utilized to form the via openings either partially or completely through the first dielectric layer 115 where the via openings 901 are desired to be located, and then the trench openings 903 are formed using the second photoresist 401 as described above with respect to FIGS. 4A-7 to form the trench openings 903. However, in this process the trench openings 903 are not extended all of the way through the first dielectric layer 115.

FIG. 9A additionally illustrates that, once the via openings 901 and the trench openings 903 have been formed to expose portions of the underlying conductive elements 103, the first conductive material 703 is deposited into the via openings 901 and the trench openings 903. The first conductive material 703 may be deposited as described above with respect to FIG. 7, such as by depositing a barrier layer and a conductive fill material to fill and/or overfill the via openings 901 and the trench openings 903. However, any suitable methods and materials may be utilized.

FIG. 9B illustrates that, after the first conductive material 703 is deposited to fill and/or overfill the via openings 901 and the trench openings 903, the first conductive material 703 may be planarized with the first dielectric layer 115 to form a second metallization layer 909. In an embodiment the first conductive material 703 may be planarized with a planarization process such as chemical mechanical polishing, grinding, etch back processes, combinations of these, or the like. Additionally, the planarization process may also remove the first layer 117. However, any suitable processes may be utilized.

By forming the via openings 901 and the trench openings 903 through the first dielectric layer 115, filling the via openings 901 and the trench openings 903 with the first conductive material 703, and then planarizing the first conductive material 703, the second conductive lines 907 are formed. Further, the second conductive lines 907 are electrically connected to the underlying conductive elements 103 through the second vias 905. As such, a dual damascene formation of the second conductive lines 907 and the second vias 905 is performed in order to electrically connect the conductive elements 103 with subsequently formed overlying elements, while still maintaining the ability to retain the cut portions 803 of the first dielectric layer 115 (e.g., an ability to have the reduced second distance $D_2$).

Figure 10:
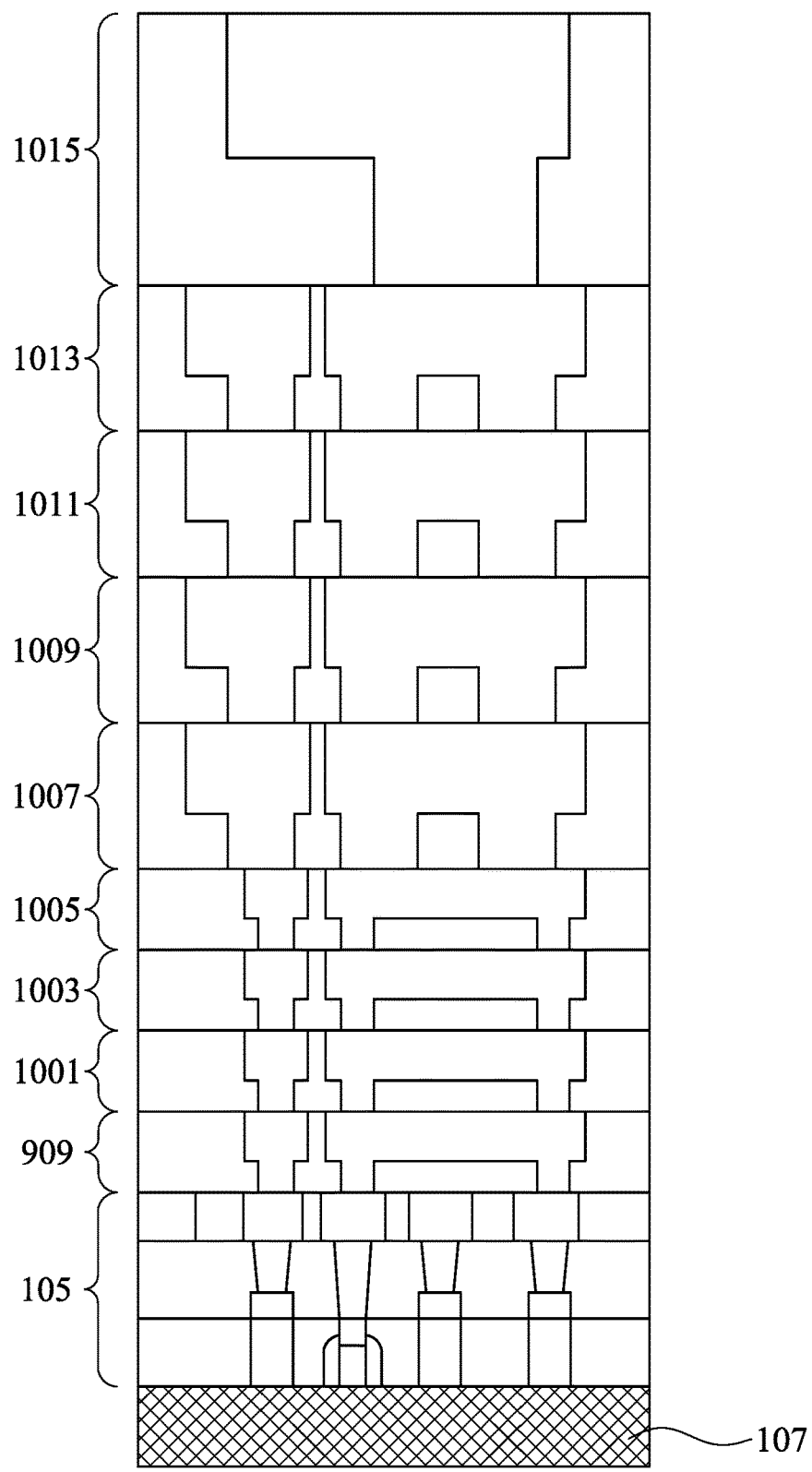
FIG. 10 illustrates formation of multiple metallization layers, in accordance with some embodiments.

FIG. 10 illustrates that, while the processes and structures described herein have been illustrated and described with respect to a single layer of the metallization layers over the semiconductor substrate, this is intended to merely be an illustrative embodiments and is not intended to be limiting to the precise layer described. In particular, once the second metallization layer 909 (with, e.g., the first thickness $T_1$) has been formed over the metallization layers 105, a third metallization layer 1001, a fourth metallization layer 1003, a fifth metallization layer 1005, a sixth metallization layer 1007 (with, e.g., a second thickness that is 2.7 times the first thickness $T_1$), a seventh metallization layer 1009 (with, e.g., a third thickness that is 2.7 times the first thickness $T_1$), an eighth metallization layer 1011 (with, e.g., a fourth thickness that is 4.5 times the first thickness $T_1$), a ninth metallization layer 1013 (with, e.g., a fifth thickness that is 9 times the first thickness $T_1$), and a tenth metallization layer 1015 (with, e.g., a sixth thickness that is 26 times the first thickness $T_1$) are sequentially formed over the second metallization layer 909. In an embodiment each of the third metallization layer 1001, the fourth metallization layer 1003, the fifth metallization layer 1005, the sixth metallization layer 1007, the seventh metallization layer 1009, the eighth metallization layer 1011, the ninth metallization layer 1013 the, and the tenth metallization layer 1015 are formed following similar processes as the second metallization layer 909 as described above with respect to FIGS. 1A-9B. However, any suitable processes and materials may be utilized.

By utilizing the processes described herein, multiple conductive lines (e.g., the first conductive lines 801) can be manufactured together with a reduced distance between them. In particular, by using the first dielectric material 201 to help form the cut portions 803, the distances between the multiple first conductive lines 801 can be reduced down to below 15 nm or even below 12 nm. Such reductions in critical dimensions between the conductive lines allows for a larger integration and further reductions in the size of the overall device.

In accordance with an embodiment, a method of manufacturing a semiconductor device, the method including: patterning a first layer a first time, the first layer being located over a first hard mask layer over a dielectric layer, the patterning the first layer the first time forming a first opening; filling the first opening with a first dielectric material; patterning the first layer a second time after the filling the first opening, the patterning the first layer the second time forming second openings in the first layer, at least one of the second openings exposing the first dielectric material; removing the first dielectric material; and patterning the dielectric layer after the removing the first dielectric material using the first layer as a mask, the patterning the dielectric layer extending the second openings. In an embodiment the method further includes filling the second openings with conductive material to form a first conductive line and a second conductive line. In an embodiment the first conductive line is located a first distance from the second conductive line, the first distance being less than 12 nm. In an embodiment the patterning the first layer the second time is performed with an extreme ultraviolet imaging process. In an embodiment the first layer comprises an oxide material. In an embodiment the method further includes planarizing the first dielectric material with the first layer. In an embodiment the planarizing is performed at least in part with an etch back process.

In accordance with another embodiment, a method of manufacturing a semiconductor device, the method includes: depositing a first layer over a hard mask layer over a first dielectric layer; embedding a first dielectric material into the first layer; depositing a photosensitive material over the first layer; patterning the photosensitive material to form a first line opening and a second line opening, the first line opening being located at least partially over the first dielectric material; patterning the hard mask layer through the first line opening and the second line opening while the first dielectric material remains in place, the first dielectric material protecting a first portion of the hard mask layer; patterning the first dielectric layer using the hard mask layer as a mask, the first portion of the hard mask layer protecting a second portion of the first dielectric layer, the patterning the first dielectric layer forming a first opening on a first side of the second portion of the first dielectric layer and forming a second opening on a second side of the second portion of the first dielectric layer, the first opening being no greater than 12 nm from the second opening; and filling the first opening and the second opening with conductive material. In an embodiment the patterning the first dielectric layer is part of a single damascene process. In an embodiment the patterning the first dielectric layer is part of a dual damascene process. In an embodiment the patterning the photosensitive material is performed at least in part with an extreme ultraviolet imaging process. In an embodiment the filling the first opening and the second opening forms a first conductive line and a second conductive line, wherein neither the first conductive line nor the second conductive line has a bird's beak shape. In an embodiment the embedding the first dielectric material is done at least in part with an atomic layer deposition process. In an embodiment the first dielectric material is titanium oxide.

In accordance with yet another embodiment, a semiconductor device includes: a semiconductor substrate; and a metallization layer overlying the semiconductor substrate, the metallization layer includes: a first dielectric material; a first conductive line embedded within the first dielectric material; and a second conductive line embedded within the first dielectric material, the first dielectric material being continuous around the first conductive line and the second conductive line in a top down view, the second conductive line being separated from the first conductive line by no more than 15 nm. In an embodiment the first conductive line extends through the first dielectric material. In an embodiment the first conductive line extends partially through the first dielectric material. In an embodiment the semiconductor device further includes a first via in physical contact with the first conductive line, the first via extending through a remainder of the first dielectric material. In an embodiment the second conductive line is separated from the first conductive line by no more than 12 nm. In an embodiment the second conductive line is separated from the first conductive line by no more than 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, the method comprising:
   patterning a first layer for a first time, the first layer being located over a first hard mask layer over a dielectric layer, the patterning the first layer for the first time forming a first opening;
   filling the first opening with a first dielectric material;
   patterning the first layer for a second time after filling the first opening, the patterning the first layer for the second time forming second openings in the first layer, at least one of the second openings exposing the first dielectric material;

removing the first dielectric material from over a first region of the dielectric layer; and patterning the dielectric layer after the removing the first dielectric material using the first layer as a mask, the patterning the dielectric layer extending the second openings, wherein at least two of the second openings are separated by a distance no longer than 12 nm, wherein the at least two of the second openings are on opposite sides of the first region of the dielectric layer.

2. The method of claim 1, further comprising filling the second openings with conductive material to form a first conductive line and a second conductive line.

3. The method of claim 2, wherein the first conductive line is located a first distance from the second conductive line, the first distance being less than 12 nm.

4. The method of claim 1, wherein the patterning the first layer the second time is performed with an extreme ultraviolet imaging process.

5. The method of claim 1, wherein the first layer comprises an oxide material.

6. The method of claim 1, further comprising planarizing the first dielectric material with the first layer.

7. The method of claim 6, wherein the planarizing is performed at least in part with an etch back process.

8. A method of manufacturing a semiconductor device, the method comprising:

depositing a first layer over a hard mask layer over a first dielectric layer;

embedding a first dielectric material into the first layer;

depositing a photosensitive material over the first layer;

patterning the photosensitive material to form a first line opening and a second line opening, the first line opening being located at least partially over the first dielectric material;

patterning the hard mask layer through the first line opening and the second line opening while the first dielectric material remains in place, the first dielectric material protecting a first portion of the hard mask layer;

patterning the first dielectric layer using the hard mask layer as a mask, the first portion of the hard mask layer protecting a second portion of the first dielectric layer, the patterning the first dielectric layer forming a first opening on a first side of the second portion of the first dielectric layer and forming a second opening on a second side of the second portion of the first dielectric layer, the first opening being no greater than 12 nm from the second opening; and filling the first opening and the second opening with conductive material.

9. The method of claim 8, wherein the patterning the first dielectric layer is part of a single damascene process.

10. The method of claim 8, wherein the patterning the first dielectric layer is part of a dual damascene process.

11. The method of claim 8, wherein the patterning the photosensitive material is performed at least in part with an extreme ultraviolet imaging process.

12. The method of claim 8, wherein the filling the first opening and the second opening forms a first conductive line and a second conductive line, wherein neither the first conductive line nor the second conductive line has a bird's beak shape.

13. The method of claim 8, wherein the embedding the first dielectric material is done at least in part with an atomic layer deposition process.

14. The method of claim 13, wherein the first dielectric material is titanium oxide.

15. A method of manufacturing a semiconductor device, the method comprising:

receiving a semiconductor substrate; and forming a metallization layer overlying the semiconductor substrate, the forming the metallization layer comprising:

forming a first dielectric material;

forming a first conductive line embedded within the first dielectric material; and forming a second conductive line embedded within the first dielectric material, the first electric material being continuous around the first conductive line and the second conductive line in a top down view, the second conductive line being separated from the first conductive line by no more than 15 nm, wherein the forming the first conductive line and the forming the second conductive line comprise:

patterning a hard mask layer, wherein during the patterning the hard mask layer a first dielectric portion embedded in an overlying mask layer is solid and protects a first portion of the hard mask layer, the first dielectric portion being a different material from a second portion of the overlying mask layer;

patterning the first dielectric material using the hard mask layer as a mask, the first portion of the hard mask layer protecting a second portion of the first dielectric material, the patterning the first dielectric material forming a first opening and a second opening; and filling the first opening and the second opening to form the first conductive line and the second conductive line, wherein the second portion of the first dielectric material is located between the first conductive line and the second conductive line.

16. The method of claim 15, wherein the first conductive line extends through the first dielectric material.

17. The method of claim 15, wherein the first conductive line extends partially through the first dielectric material.

18. The method of claim 17, further comprising forming a first via, wherein after the forming the first via and the forming the first conductive line, the first via is in physical contact with the first conductive line, the first via extending through a remainder of the first dielectric material.

19. The method of claim 15, wherein the second conductive line is separated from the first conductive line by no more than 12 nm.

20. The method of claim 17, wherein the second conductive line is separated from the first conductive line by no more than 5 nm.

* * * * *